United States Patent
Araki et al.

(10) Patent No.: US 10,442,958 B2
(45) Date of Patent: Oct. 15, 2019

(54) ANISOTROPIC CONDUCTIVE FILM AND PRODUCTION METHOD OF THE SAME

(71) Applicant: DEXERIALS CORPORATION, Tokyo (JP)

(72) Inventors: Yuta Araki, Tochigi (JP); Tomoyuki Ishimatsu, Utsunomiya (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

(21) Appl. No.: 15/126,898

(22) PCT Filed: Jan. 29, 2015

(86) PCT No.: PCT/JP2015/052453
§ 371 (c)(1),
(2) Date: Sep. 16, 2016

(87) PCT Pub. No.: WO2015/141289
PCT Pub. Date: Sep. 24, 2015

(65) Prior Publication Data
US 2017/0107406 A1    Apr. 20, 2017

(30) Foreign Application Priority Data

Mar. 20, 2014 (JP) .................. 2014-079746

(51) Int. Cl.
*C09J 7/10* (2018.01)
*C09J 9/02* (2006.01)
(Continued)

(52) U.S. Cl.
CPC .................. *C09J 7/00* (2013.01); *B32B 27/06* (2013.01); *B32B 27/08* (2013.01); *B32B 27/18* (2013.01);
(Continued)

(58) Field of Classification Search
CPC ......... B32B 27/08; B32B 27/20; H01L 24/27; H01L 24/29; H01L 24/83; H01L 2224/27334; C09J 9/02; C09J 7/00
See application file for complete search history.

(56) References Cited

U.S. PATENT DOCUMENTS

2006/0100314 A1* 5/2006 Arifuku .................. C09J 9/02
523/210
2008/0211092 A1* 9/2008 Lu .................. H01L 23/49811
257/737
(Continued)

FOREIGN PATENT DOCUMENTS

CN    103391692 A    11/2013
JP    2000-323523 A    11/2000
(Continued)

OTHER PUBLICATIONS

English Translation of JP-2011109149.*
(Continued)

*Primary Examiner* — Evren Seven
*Assistant Examiner* — Long H Le
(74) *Attorney, Agent, or Firm* — Oliff PLC

(57) ABSTRACT

An anisotropic conductive film contains conductive particles and spacers. The spacers are arranged at a central part of the film in a width direction. The central part of the film in the width direction represents 20 to 80% of the overall width of the film. The height of the spacers in the thickness direction of the anisotropic conductive film is larger than 5 μm and less than 75 μm. Such an anisotropic conductive film has a layered structure having a first insulating adhesion layer and a second insulating adhesion layer, wherein the conductive particles are dispersed in the first insulating adhesion layer,
(Continued)

and the spacers are regularly arranged on a surface of the first insulating adhesion layer on a side of the second insulating adhesion layer.

19 Claims, 6 Drawing Sheets

(51) Int. Cl.
| | |
|---|---|
| *B32B 27/20* | (2006.01) |
| *B32B 27/08* | (2006.01) |
| *H01L 23/00* | (2006.01) |
| *C09J 7/00* | (2018.01) |
| *C09J 11/02* | (2006.01) |
| *B32B 27/06* | (2006.01) |
| *B32B 27/18* | (2006.01) |
| *C08K 7/00* | (2006.01) |

(52) U.S. Cl.
CPC .......... *B32B 27/20* (2013.01); *C09J 7/10* (2018.01); *C09J 9/02* (2013.01); *C09J 11/02* (2013.01); *H01L 24/27* (2013.01); *H01L 24/29* (2013.01); *H01L 24/81* (2013.01); *H01L 24/83* (2013.01); *B32B 2307/20* (2013.01); *B32B 2307/202* (2013.01); *B32B 2307/206* (2013.01); *B32B 2307/706* (2013.01); *B32B 2457/00* (2013.01); *B32B 2457/14* (2013.01); *C08K 7/00* (2013.01); *C08K 2201/001* (2013.01); *C09J 2201/134* (2013.01); *C09J 2201/36* (2013.01); *C09J 2201/602* (2013.01); *C09J 2203/326* (2013.01); *C09J 2205/102* (2013.01); *C09J 2433/00* (2013.01); *C09J 2463/00* (2013.01); *C09J 2471/00* (2013.01); *H01L 24/13* (2013.01); *H01L 24/16* (2013.01); *H01L 24/32* (2013.01); *H01L 2224/13144* (2013.01); *H01L 2224/16227* (2013.01); *H01L 2224/2612* (2013.01); *H01L 2224/271* (2013.01); *H01L 2224/27003* (2013.01); *H01L 2224/27334* (2013.01); *H01L 2224/294* (2013.01); *H01L 2224/2929* (2013.01); *H01L 2224/2939* (2013.01); *H01L 2224/29082* (2013.01); *H01L 2224/29083* (2013.01); *H01L 2224/29295* (2013.01); *H01L 2224/29339* (2013.01); *H01L 2224/29344* (2013.01); *H01L 2224/29347* (2013.01); *H01L 2224/29355* (2013.01); *H01L 2224/29357* (2013.01); *H01L 2224/29364* (2013.01); *H01L 2224/29387* (2013.01); *H01L 2224/29455* (2013.01); *H01L 2224/29464* (2013.01); *H01L 2224/29499* (2013.01); *H01L 2224/32227* (2013.01); *H01L 2224/73204* (2013.01); *H01L 2224/81191* (2013.01); *H01L 2224/81488* (2013.01); *H01L 2224/81903* (2013.01); *H01L 2224/83007* (2013.01); *H01L 2224/83138* (2013.01); *H01L 2224/83192* (2013.01); *H01L 2224/83203* (2013.01); *H01L 2224/83488* (2013.01); *H01L 2224/83851* (2013.01); *H01L 2224/83871* (2013.01); *H01L 2924/07* (2013.01); *H01L 2924/3511* (2013.01)

(56) References Cited

U.S. PATENT DOCUMENTS

| | | | | |
|---|---|---|---|---|
| 2012/0118480 | A1* | 5/2012 | Paik | ............ C09J 5/06 |
| | | | | 156/73.1 |
| 2012/0228805 | A1* | 9/2012 | Kim | ............ C09J 133/08 |
| | | | | 264/460 |

FOREIGN PATENT DOCUMENTS

| | | | | |
|---|---|---|---|---|
| JP | 2005-203758 | A | | 7/2005 |
| JP | 2008-034232 | A | | 2/2008 |
| JP | 2011-109149 | A | | 6/2011 |
| JP | 2011109149 | | * 6/2011 | ............ H01L 21/60 |
| JP | 2011109149 | A | * 6/2011 | |

OTHER PUBLICATIONS

May 3, 2018 Office Action issued in Chinese Patent Application No. 201580009455.2.
Apr. 28, 2015 International Search Report issued in International Patent Application No. PCT/JP2015/052453.
Apr. 28, 2015 Written Opinion issued in International Patent Application No. PCT/JP2015/052453.
Jan. 16, 2018 Notification of Reasons for Refusal issued in Japanese Patent Application No. 2014-079746.
Jan. 14, 2019 Office Action issued in Taiwanese Patent Application No. 104104521.
Sep. 4, 2018 Office Action issued in Japanese Patent Application No. 2014-079746.
Apr. 10, 2019 Office Action issued in Chinese Patent Application No. 201580009455.2.
Apr. 30, 2019 Office Action issued in Taiwanese Patent Application No. 104104521.

* cited by examiner

ANISOTROPIC CONDUCTIVE FILM AND PRODUCTION METHOD OF THE SAME

TECHNICAL FIELD

The present invention relates to an anisotropic conductive film and a production method of the same.

BACKGROUND ART

An anisotropic conductive film has been widely used in flip-chip mounting of an IC chip on a glass substrate or the like. The IC chip applied to such a case has a rectangular shape in many cases. A plurality of bumps are formed on a straight line at a constant pitch at end parts of two opposite sides on the back surface of the IC chip, and the bumps are not formed at a central part of the back surface. Therefore, the IC chip has a problem in which the central part is bent toward a side of the glass substrate during anisotropic conductive connection. When this bending occurs, it is difficult for conductive particles to be uniformly pushed against all of the bumps during anisotropic conductive connection, and in particular, the conductive particles tend to be ununiformly pushed against the bumps at a bump line along the long side of the IC chip. In order to solve such a problem, the formation of dummy bumps at the central part of the back surface of the IC chip (Patent Literature 1) and an anisotropic conductive film in which spacers having a particle diameter larger than that of the conductive particles are uniformly dispersed (Patent Literature 2) have been proposed.

CITATION LIST

Patent Literature

Patent Literature 1: Japanese Patent Application Laid-Open No. 2005-203758
Patent Literature 2: Japanese Patent Application Laid-Open No. 2000-323523

SUMMARY OF INVENTION

Technical Problem

However, when the dummy bumps are provided on the IC chip, there are problems in which the number of processes for producing the IC chip increases and the degree of freedom of change in a design of the IC chip decreases. When the spacers are uniformly dispersed in the anisotropic conductive film, there may be a case in which the spacers may be placed between the bumps of the IC chip and terminals of the glass substrate. Accordingly, there are problems in which conduction may not be achieved, and conduction reliability may be reduced.

An object of the present invention is to solve the problems in the conventional techniques, and to solve the problem in which the central part of the IC chip is bent toward the glass substrate during anisotropic conductive connection and the problem in which the uniformity of pushing of the conductive particles against the individual bumps is impaired due to the bending without providing dummy bumps on the IC chip and uniformly dispersing the spacers in the anisotropic conductive film.

Solution to Problem

The present inventor has found that when a spacer is selectively disposed at a region where bumps of an IC chip are not opposite in an anisotropic conductive film, the object of the present invention can be achieved. The present invention has thus been completed.

Specifically, the present invention provides an anisotropic conductive film containing conductive particles and spacers, wherein the spacers are arranged at a central part of the anisotropic conductive film in a width direction.

As a preferred aspect, the present invention provides the following aspects A, B, C, and D.
(Aspect A)
An aspect in which the anisotropic conductive film has a layered structure having a first insulating adhesion layer and a second insulating adhesion layer, wherein the conductive particles are dispersed in the first insulating adhesion layer, and the spacers are regularly arranged on a surface of the first insulating adhesion layer on a side of the second insulating adhesion layer.
(Aspect B)
An aspect in which the anisotropic conductive film has a layered structure having a first insulating adhesion layer and a second insulating adhesion layer, wherein the conductive particles are dispersed in the first insulating adhesion layer, and the spacers are regularly arranged on a surface of the second insulating adhesion layer on a side of the first insulating adhesion layer.
(Aspect C)
An aspect in which the anisotropic conductive film has a layered structure having a first insulating adhesion layer and a second insulating adhesion layer, wherein the conductive particles and the spacers are each regularly arranged on a surface of the first insulating adhesion layer on a side of the second insulating adhesion layer.
(Aspect D)
An aspect in which the anisotropic conductive film has a layered structure having a first insulating adhesion layer and a second insulating adhesion layer, wherein the conductive particles are regularly arranged on a surface of the first insulating adhesion layer on a side of the second insulating adhesion layer, and the spacers are regularly arranged on a surface of the second insulating adhesion layer on a side of the first insulating adhesion layer.

Further, the present invention provides a production method of the anisotropic conductive film that includes storing each of the spacers in a first opening for storing a spacer of a transfer mold having the first opening at a position corresponding to the central part of the anisotropic conductive film in the width direction, and pushing an insulating adhesion layer that constitutes the anisotropic conductive film into a surface having the first opening of the transfer mold to transfer and bond the spacers to the insulating adhesion layer.

Moreover, the present invention provides a production method of the anisotropic conductive film of the aspect A that includes storing each of the spacers in a first opening for storing a spacer of a transfer mold having the first opening at a position corresponding to the central part of the anisotropic conductive film in the width direction, pushing the first insulating adhesion layer that constitutes the anisotropic conductive film and has the dispersed conductive particles into a surface having the first opening of the transfer mold to transfer and bond the spacers to the first insulating adhesion layer, and further layering the second insulating adhesion layer.

The present invention provides a production method of the anisotropic conductive film of the aspect B that includes storing each of the spacers in a first opening for storing a spacer of a transfer mold having the first opening at a position corresponding to the central part of the anisotropic conductive film in the width direction, pushing the second insulating adhesion layer that constitutes the anisotropic conductive film into a surface having the first opening of the transfer mold to transfer and bond the spacers to the second insulating adhesion layer, and further layering the first insulating adhesion layer that constitutes the anisotropic conductive film and has the dispersed conductive particles.

The present invention provides a production method of the anisotropic conductive film of the aspect C that includes storing each of the spacers in a first opening for storing a spacer of a transfer mold having the first opening at a position corresponding to the central part of the anisotropic conductive film in the width direction and a second opening for storing a conductive particle at a part other than the position, subsequently storing each of the conductive particles in the second opening, pushing the first insulating adhesion layer that constitutes the anisotropic conductive film and has the dispersed conductive particles into a surface having the first and second openings of the transfer mold to transfer and bond the spacers to the first insulating adhesion layer, and further layering the second insulating adhesion layer.

Moreover, the present invention provides a method for producing the anisotropic conductive film of the aspect D that includes:

storing each of the spacers in a first opening for storing a spacer of a first transfer mold having the first opening at a position corresponding to the central part of the anisotropic conductive film in the width direction, and pushing the first insulating adhesion layer that constitutes the anisotropic conductive film into a surface having the first opening of the first transfer mold to transfer and bond the spacers to the first insulating adhesion layer;

storing each of the conductive particles in a second opening for storing a conductive particle of a second transfer mold having the second opening at a position corresponding to a part other than the central part of the anisotropic conductive film in the width direction, and pushing the second insulating adhesion layer that constitutes the anisotropic conductive film into a surface having the second opening of the second transfer mold to transfer and bond the conductive particles to the second insulating adhesion layer; and layering the first insulating adhesion layer to which the spacers have been transferred and bonded and the second insulating adhesion layer to which the conductive particles have been transferred and bonded so that the spacers and the conductive particles are located inside.

The present invention provides a connection structure in which a first electronic component is subjected to anisotropic conductive connection to a second electronic component through the above-described anisotropic conductive film.

Furthermore, the present invention provides a method for connecting a first electronic component and a second electronic component by anisotropic conductive connection through the above-described anisotropic conductive film, the method including temporarily bonding the anisotropic conductive film to the second electronic component, mounting the first electronic component on the temporarily bonded anisotropic conductive film, and thermocompression-bonding them from a side of the first electronic component.

Advantageous Effects of Invention

In the anisotropic conductive film of the present invention, spacers are arranged at a central part thereof in a width direction. Therefore, bending of an IC chip generated during anisotropic conductive connection can be suppressed. Accordingly, the initial conduction value cannot be increased, and the short circuit occurrence ratio can be suppressed.

DESCRIPTION OF EMBODIMENTS

Hereinafter, an example of the anisotropic conductive film of the present invention will be described in detail.

<<Anisotropic Conductive Film>>

Figure 1:
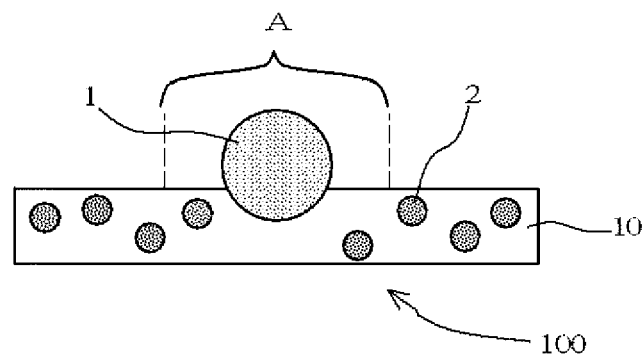
FIG. 1 is a cross-sectional view of an anisotropic conductive film of the present invention.

As shown in FIG. 1, in an anisotropically conductive film 100 of the present invention, spacers 1 are arranged at a central part of the anisotropic conductive film 100 in a width direction of the film (that is, spacer-disposing region A). In general, this anisotropic conductive film 100 has a structure in which conductive particles 2 are dispersed in an insulating adhesion layer 10.

(Spacer-Disposing Region A)

Figure 2:
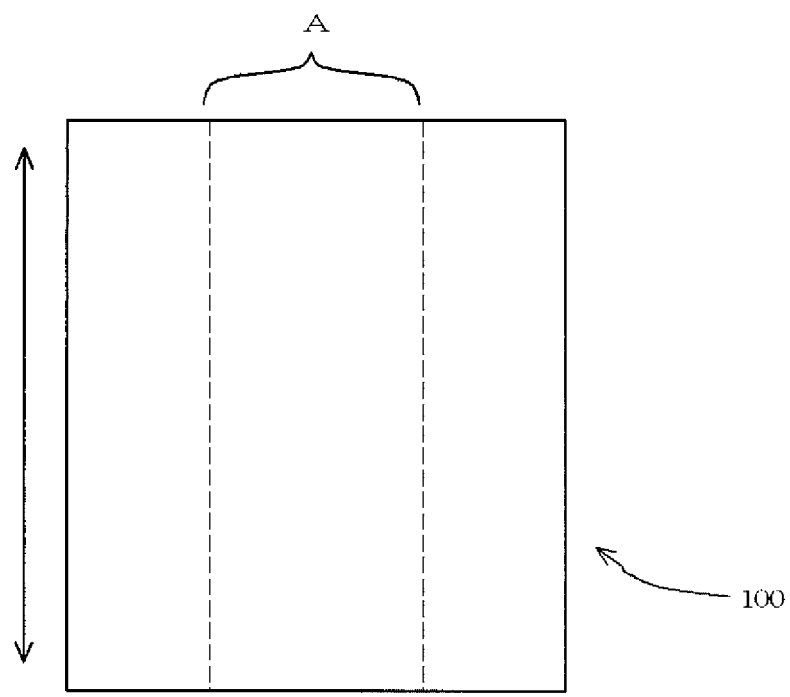
FIG. 2 is a top plan view of the anisotropic conductive film of the present invention.

The spacer-disposing region A is at a central part of an anisotropic conductive film in a width direction. This central part in the width direction is a region that is preferably 20% or more and 80% or less, and more preferably 30% or more and 70% or less of the overall width of the anisotropic conductive film in order to achieve reliable anisotropic conductive connection and not to bring spacers into contact with bumps. As shown in FIG. 2, in general, this region is continuously provided in a longitudinal direction (arrow direction) of the anisotropic conductive film 100. It is preferable that a center line of the spacer-disposing region A in the longitudinal direction of the film be parallel to the longitudinal direction of the anisotropic conductive film. Further, it is preferable that this center line of the spacer-disposing region A in the longitudinal direction of the film exist at a region from an end part of the film in the width direction to 20 to 50% of the width of the film in consideration of a case where a region where a bump line of an IC chip is sandwiched (corresponding to the spacer-disposing region A) is located at any of right and left sides of the IC chip, but not in the center of the IC chip.

(Spacer 1)

As the spacers 1, insulating particles such as aluminum oxide particles, silicon oxide particles, zinc oxide particles, and polystyrene particles can be used. When a size obtained by adding 30% or more and 80% or less of the average particle diameter of the conductive particles to the sum of the bump height of an IC chip and the terminal thickness of a wiring is taken as 100, the size of the spacers 1 is preferably 60 to 140, and more preferably 80 to 120. This is because uneven contact at a side of long side of the IC is prevented and the size corresponds to a roughness of a surface of the IC on a bump side. Specifically, it is preferable that the size be more than 5 μm and less than 75 μm.

Examples of shape of the spacers 1 may include spherical, elliptical, conical, pyramidal, columnar, prismatic, and needle shapes. In consideration of difficulty in overlapping the spacers with the conductive particles, a curved shape such as a spherical shape and a columnar shape is preferable. It is desirable that a curved part be opposite to a face of the film. This is because in a case of overlapping the spacers with the conductive particles, the overlapping is easily solved during anisotropic conductive connection.

It is preferable that the height of the spacers 1 (the size of the anisotropic conductive film in a thickness direction) be the size obtained by adding 30% or more and 80% or less of the average particle diameter of the conductive particles to the sum of the bump height of the IC chip and the terminal thickness of the wiring. Specifically, it is preferable that the height be more than 5 μm and less than 75 μm.

The area occupancy ratio of the spacers 1 on the surface of the anisotropic conductive film is preferably 2% or more. It is preferable that the distance between the spacers 1 as particles be two times or more the size of the conductive particles 2. This is because resin flow during connection is not inhibited.

When the shape of the spacers 1 is not spherical, the average of maximum lengths of the spacers 1 as viewed in a plane direction of the film is preferably 10 times or less, more preferably 5 times or less, and particularly preferably 3 times or less the average particle diameter of the conductive particles 2. This is because excess flow of the conductive particles 2 is not suppressed since the spacers 1 are positioned at a region where the resin flow is relatively the largest.

As a pattern of arrangement of the spacers 1, various arrangement patterns can be utilized as long as the patterns are such a pattern that the spacers are arranged at the spacer-disposing region A and regularly repeated. Examples of the patterns may include straight line, curvilinear (wave-shaped), and bent line patterns. When the spacers 1 have anisotropy in a plane direction (in a case of a columnar shape or the like), the regularity of the arrangement is represented by virtual circles circumscribing the spacers 1. Therefore, directions of anisotropy may be random.

Figure 3A:
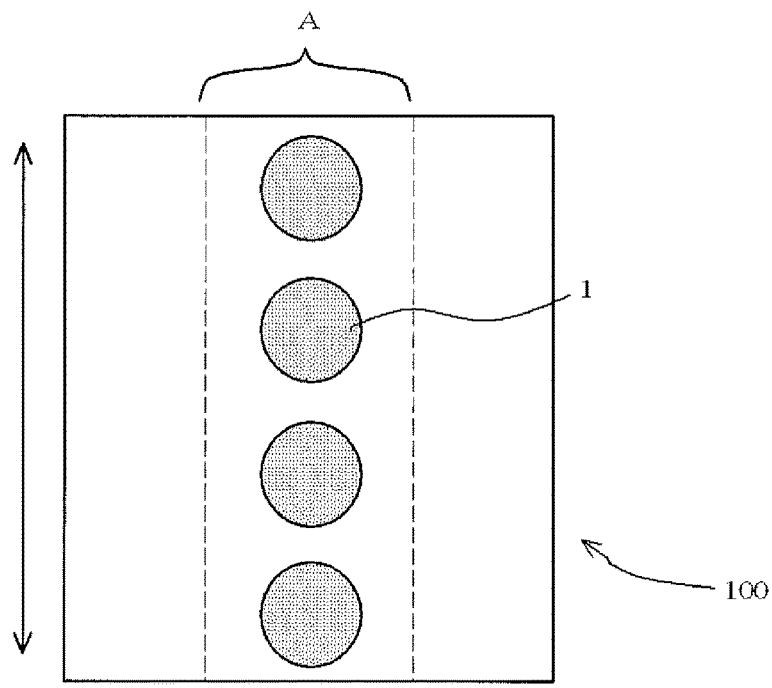
FIG. 3A is a top plan view of an anisotropic conductive film of the present invention.
Figure 3B:
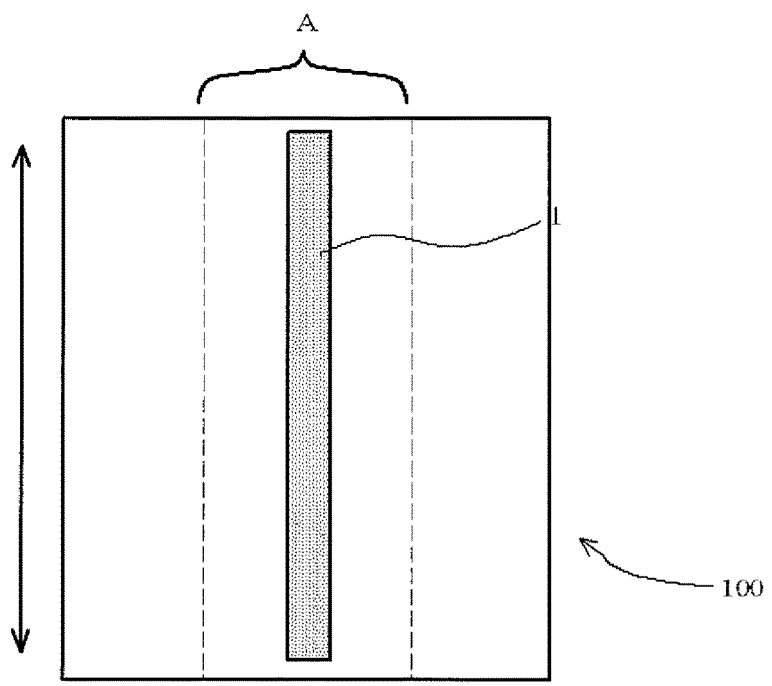
FIG. 3B is a top plan view of an anisotropic conductive film of the present invention.
Figure 3C:
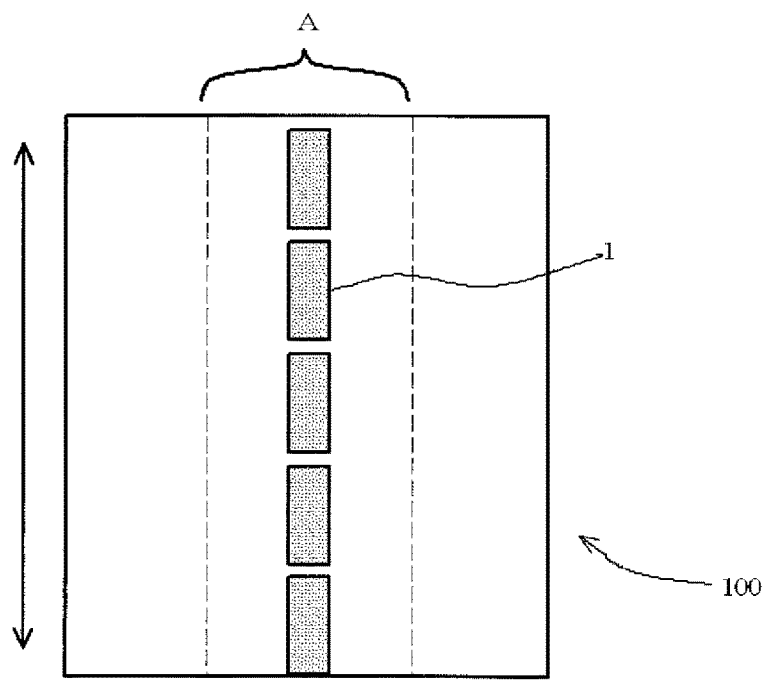
FIG. 3C is a top plan view of an anisotropic conductive film of the present invention.
Figure 3D:
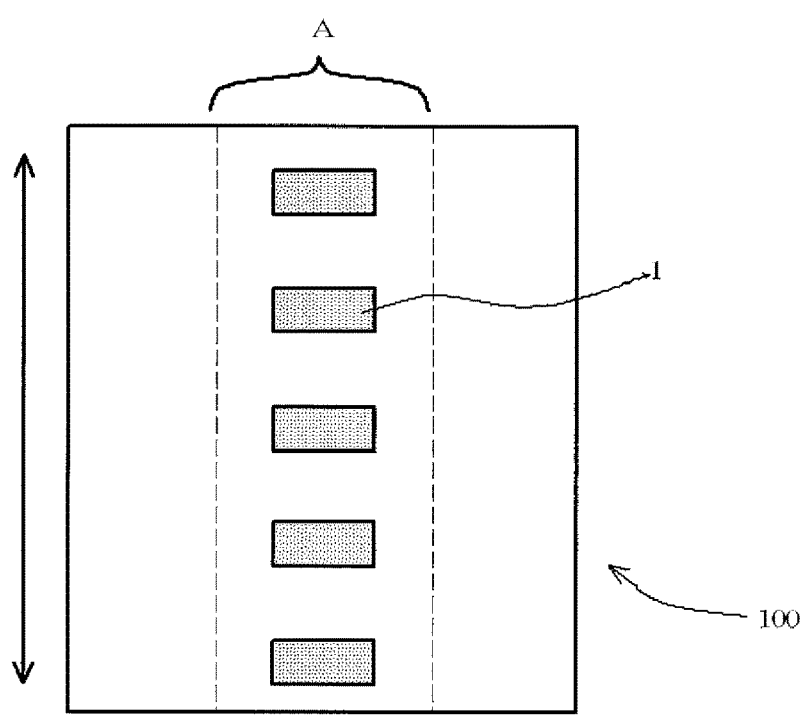
FIG. 3D is a top plan view of an anisotropic conductive film of the present invention.
Figure 3E:
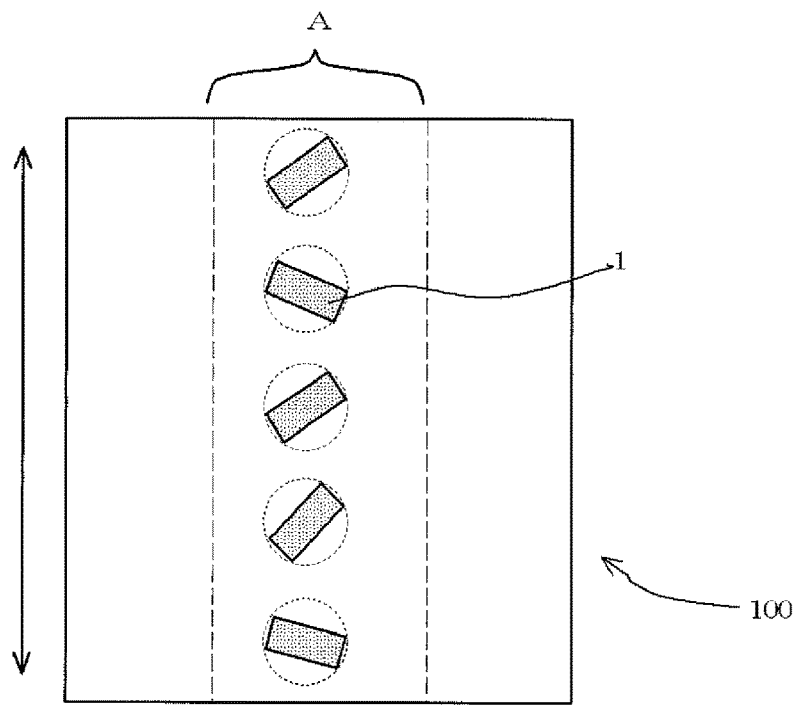
FIG. 3E is a top plan view of an anisotropic conductive film of the present invention.
Figure 3F:
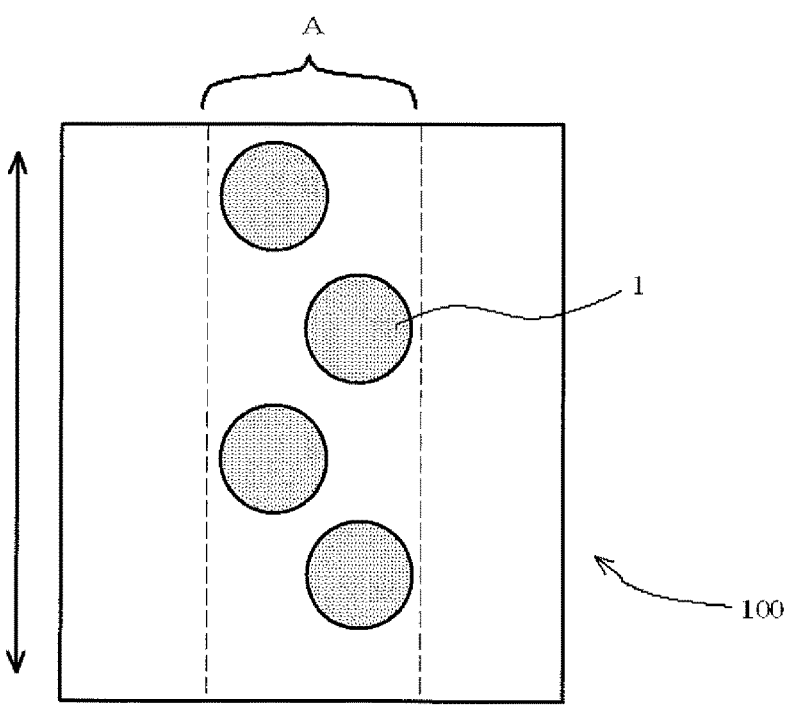
FIG. 3F is a top plan view of an anisotropic conductive film of the present invention.

Examples of preferred aspects of the spacers 1 as viewed in the plane direction may include, but not limited to, an aspect in which the spacers 1 having a particle shape are disposed at a predetermined pitch on a line in the longitudinal direction of the spacer-disposing region A, as shown in FIG. 3A; an aspect in which the spacers 1 having an elongated bar shape are disposed in a direction parallel to the longitudinal direction of the film, as shown in FIG. 3B; an aspect in which the spacers 1 having a minute bar shape are disposed at a predetermined pitch so that the longitudinal directions of the spacers 1 are parallel to the longitudinal direction of the film, as shown in FIG. 3C; an aspect in which the spacers 1 having a minute bar shape are disposed at a predetermined pitch so that the longitudinal directions of the spacers 1 are orthogonal to the longitudinal direction of the film, as shown in FIG. 3D; an aspect in which the spacers 1 having a minute bar shape are disposed at a predetermined pitch (on the basis of center of circumscribed circle (in the drawing, dotted line circle) of the spacers having a minute bar shape) so that the longitudinal directions of the spacers 1 are randomly disposed with respect to the longitudinal direction of the film, as shown in FIG. 3E; and an aspect in which the spacers 1 having a spherical shape are disposed at a predetermined pitch on two lines, as shown in FIG. 3F. It is desirable that the disposed positions of the spacers 1 exist near a center of a region that is placed between bump lines arranged linearly at end parts of the IC chip. The bending during connection occurs near the center. It is not general that the bump number, line number, and total area of the bump lines at the end parts of the IC are symmetric. Therefore, desired positions of the spacers 1 on a film plane are not necessarily at the center, but the spacers 1 near the center can contribute to a decrease in bending.

(Preferred Aspects of Anisotropic Conductive Film)

Hereinafter, preferred aspects A to D of the anisotropic conductive film of the present invention will be described, but the present invention is not limited to these aspects.

"Aspect A"

Figure 4:
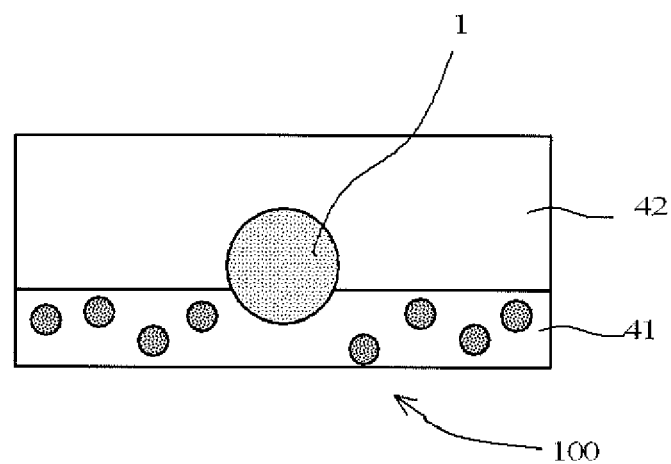
FIG. 4 is a cross-sectional view of an anisotropic conductive film of the present invention.

An aspect A is an aspect in which the anisotropic conductive film 100 has a layered structure having a first insulating adhesion layer 41 and a second insulating adhesion layer 42, wherein the conductive particles 2 are dispersed in the first insulating adhesion layer 41, and the spacers 1 are regularly arranged on a surface of the first insulating adhesion layer 41 on a side of the second insulating adhesion layer 42, as shown in FIG. 4.

"Aspect B"

Figure 5:
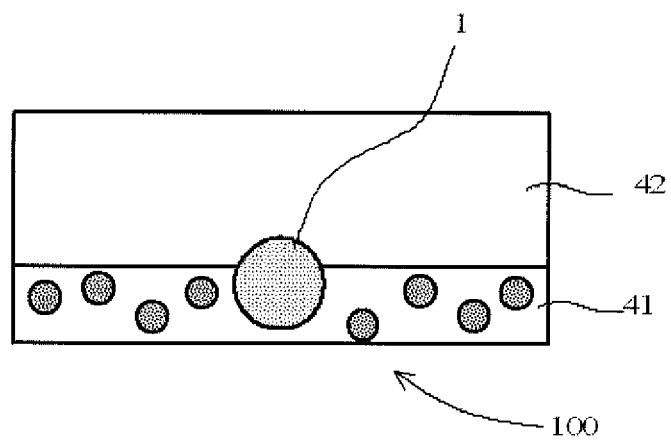
FIG. 5 is a cross-sectional view of an anisotropic conductive film of the present invention.

An aspect B is an aspect in which the anisotropic conductive film 100 has a layered structure having the first insulating adhesion layer 41 and the second insulating adhesion layer 42, wherein the conductive particles 2 are dispersed in the first insulating adhesion layer 41, and the spacers are regularly arranged on a surface of the second insulating adhesion layer 42 on a side of the first insulating adhesion layer 41, as shown in FIG. 5.

"Aspect C"

Figure 6:
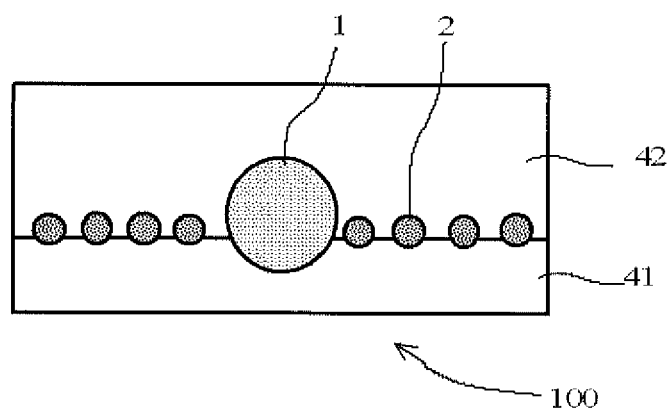
FIG. 6 is a cross-sectional view of an anisotropic conductive film of the present invention.

An aspect C is an aspect in which the anisotropic conductive film 100 has a layered structure having the first insulating adhesion layer 41 and the second insulating adhesion layer 42, wherein the conductive particles 2 and the spacers 1 are each regularly arranged on a surface of the first insulating adhesion layer 41 on a side of the second insulating adhesion layer 42, as shown in FIG. 6.

"Aspect D"

Figure 7:
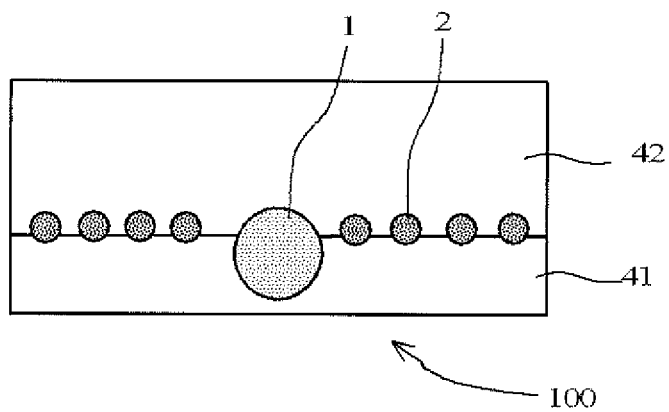
FIG. 7 is a cross-sectional view of an anisotropic conductive film of the present invention.

An aspect D is an aspect in which the anisotropic conductive film 100 has a layered structure having the first insulating adhesion layer 41 and the second insulating adhesion layer 42, wherein the conductive particles are regularly arranged on a surface of the first insulating adhesion layer on a side of the second insulating adhesion layer, and the spacers are regularly arranged on a surface of the second insulating adhesion layer on a side of the first insulating adhesion layer, as shown in FIG. 7.

In each of the aspects A, B, C, and D, the conductive particles 2 and the spacers 1 may be overlapped in the thickness direction of the anisotropic conductive film 100. Even in such a case, such overlapping is generally solved by pressurization during anisotropic conductive connection and resin flow. Therefore, in practical terms, a problem hardly occurs. However, when the area of a part in which the conductive particles 2 and the spacers 1 are overlapped is too large as the spacers 1 are viewed in a direction of anisotropic conductive connection, the overlapping may not be solved during anisotropic conductive connection. Accordingly, the overlapped area of the spacers 1 with the conductive particles 2 is preferably less than 50%, and more preferably 30% or less.

<Conductive Particle 2>

As the conductive particles 2, conductive particles used in a conventionally known anisotropic conductive film can be appropriately selected and used. Examples thereof may include particles of metals such as nickel, cobalt, silver, copper, gold, and palladium, and metal-coating resin particles. Two kinds or more thereof may be used in combination.

In order to correspond to dispersion of wiring height, suppress an increase in conduction resistance, and suppress occurrence of short circuit, the average particle diameter of the conductive particles 2 is preferably 1 to 10 and more preferably 2 to 6 μm. The average particle diameter can be measured by a general particle size distribution measurement device.

In order to suppress a decrease in conductive particle capture efficiency and suppress occurrence of short circuit, the amount of the conductive particles 2 existing in the anisotropic conductive film 100 is preferably 50 particles or more and 100,000 particles or less, and more preferably 200 particles or more and 70,000 particles or less per square millimeter of the film. When the conductive particles are arranged, the amount is preferably 50 particles or more and 40,000 particles or less per square millimeter.

"Arrangement of Conductive Particles 2 into Regular Pattern"

A regular pattern in the arrangement of the conductive particles 2 into the regular pattern means an arrangement in which the conductive particles 2 that can be recognized when the conductive particles 2 are viewed from a surface of the anisotropic conductive film 100 exist at points of a lattice such as a rectangular lattice, a square lattice, a hexagonal lattice, and a rhombic lattice. Virtual lines constituting the lattices may be straight lines, curves, or bent lines.

The ratio of the conductive particles 2 arranged in the regular pattern to all of the conductive particles 2 is preferably 90% or more in terms of the number of the conductive particles for stabilization of anisotropic connection. This ratio can be measured using an optical microscope or the like.

Further, the interparticle distance of the conductive particles 2, that is, the shortest distance between the conductive particles is preferably 0.5 times or more, and more preferably 1 time or more and 5 times or less the average particle diameter of the conductive particles 2.

<Insulating Adhesion Layer 10, First Insulating Adhesion Layer 41, and Second Insulating Adhesion Layer 42 (Hereinafter Sometimes Simply Referred to as Insulating Adhesion Layer)>

As the insulating adhesion layer (10, 41, and 42) that constitutes the anisotropic conductive film 100 of the present invention, an insulating resin layer used in a publicly known anisotropic conductive film can be appropriately adopted. For example, when a thermally or photopolymerizable resin such as a thermally or photo-cationically, anionically, or radically polymerizable resin is polymerized so that the polymerization ratio is preferably 50% or more and 100% or less, the conductive particles can be fixed, and the resin is unlikely to flow even under heating during anisotropic conductive connection. Therefore, the occurrence of short circuit can be largely suppressed. Accordingly, the conduction reliability and the insulating properties can be improved, and the mounting particle capture efficiency can also be improved. The particularly preferable insulating adhesion layer is a photo-radically polymerized resin layer obtained by photo-radically polymerizing a photo-radically polymerizable resin layer containing an acrylate compound and a photo-radical polymerization initiator. Hereinafter, a case where the insulating adhesion layer is the photo-radically polymerized resin layer will be described.

(Acrylate Compound)

As an acrylate compound that is an acrylate unit, a conventionally known photo-radically polymerizable acrylate can be used. For example, a monofunctional (meth)acrylate (herein, (meth)acrylate includes acrylate and methacrylate), or a multifunctional (meth)acrylate having two or more functional groups can be used. In the present invention, in order to make an adhesive thermosettable, it is preferable that a multifunctional (meth)acrylate be used in at least a portion of acrylic monomers.

The content of the acrylate compound in the insulating adhesion layer is preferably 2% by mass or more and 70% by mass or less, and more preferably 10% by mass or more and 50% by mass or less in terms of balance of viscosity and curing shrinkage ratio.

(Photo-Radical Polymerization Initiator)

As the photo-radical polymerization initiator, a publicly known photo-radical polymerization initiator can be appropriately selected and used. Examples of the publicly known photo-radical polymerization initiator may include an acetophenone-based photopolymerization initiator, a benzylketal-based photopolymerization initiator, and a phosphorus-based photopolymerization initiator.

When the amount of the photo-radical polymerization initiator to be used is too small relative to 100 parts by mass of the acrylate compound, photo-radical polymerization does not sufficiently proceed. When the amount is too large, stiffness may decrease. Therefore, the amount is preferably 0.1 parts by mass or more and 25 parts by mass or less, and more preferably 0.5 parts by mass or more and 15 parts by mass or less.

In the insulating adhesion layer, if necessary, a film-forming resin such as a phenoxy resin, an epoxy resin, an unsaturated polyester resin, a saturated polyester resin, a urethane resin, a butadiene resin, a polyimide resin, a polyamide resin, and a polyolefin resin can also be used in combination. In the insulating adhesion layer to be described later, the film-forming resin may also be used in combination similarly.

When the thickness of the insulating adhesion layer is too small, the mounting conductive particle capture efficiency tends to decrease. When the thickness is too large, the conduction resistance tends to increase. Therefore, the thickness is preferably 1 μm or more and 15 μm or less, and more preferably 2 to 10 μm.

The insulating adhesion layer may further contain an epoxy compound and a thermal or photo-cationic or anionic polymerization initiator as necessary. Thus, the delamination strength can be improved.

(Epoxy Compound)

When the insulating adhesion layer is the thermally or photo-cationically or anionically polymerizable resin layer containing an epoxy compound and a thermal or photo-cationic or anionic polymerization initiator, examples of the epoxy compound may include a compound or a resin having two or more epoxy groups in the molecule. The compound and the resin may be liquid or solid.

(Thermal Cationic Polymerization Initiator)

As the thermal cationic polymerization initiator, a publicly known thermal cationic polymerization initiator for an epoxy compound can be used. For example, the thermal cationic polymerization initiator generates an acid, which can cationically polymerize a cationically polymerizable compound, by heat. A publicly known iodonium salt, sulfonium salt, phosphonium salt, or ferrocenes can be used. An aromatic sulfonium salt that exhibits favorable latency for temperature can be preferably used.

When the amount of the thermal cationic polymerization initiator to be added is too small, curing tends to be difficult. When the amount is too large, the product life tends to be reduced. Therefore, the amount is preferably 2 parts by mass or more and 60 parts by mass or less, and more preferably 5 parts by mass or more and 40 parts by mass or less, relative to 100 parts by mass of the epoxy compound.

(Thermal Anionic Polymerization Initiator)

As the thermal anionic polymerization initiator, a publicly known thermal anionic polymerization initiator for an epoxy compound can be used. For example, the thermal anionic polymerization initiator generates a base, which can anionically polymerize an anionically polymerizable compound, by heat. A publicly known aliphatic amine-based compound, aromatic amine-based compound, secondary or tertiary amine-based compound, imidazole-based compound, polymercaptan-based compound, boron trifluoride-amine complex, dicyandiamide, or organic acid hydrazide can be used. An encapsulated imidazole-based compound that exhibits favorable latency for temperature can be preferably used.

When the amount of the thermal anionic polymerization initiator to be added is too small, curing tends to be difficult. When the amount is too large, the product life tends to be reduced. Therefore, the amount is preferably 2 parts by mass or more and 60 parts by mass or less, and more preferably 5 parts by mass or more and 40 parts by mass or less, relative to 100 parts by mass of the epoxy compound.

(Photo-Cationic Polymerization Initiator and Photo-Anionic Polymerization Initiator)

As the photo-cationic polymerization initiator or the photo-anionic polymerization initiator for an epoxy compound, a publicly known polymerization initiator can be appropriately used.

<<Production Method of Anisotropic Conductive Film>>

Next, an example of a production method of the anisotropic conductive film of the present invention will be simply described.

(Production Method 1)

The anisotropic conductive film containing the conductive particles and the spacers, wherein the spacers are arranged at the central part of the anisotropic conductive film in the width direction, can be produced by storing each of the spacers in a first opening for storing a spacer of a transfer mold having the first opening at a position corresponding to the central part of the anisotropic conductive film in the width direction, and pushing the insulating adhesion layer that constitutes the anisotropic conductive film into a surface having the first opening of the transfer mold to transfer and bond the spacers to the insulating adhesion layer.

(Production Method 2)

The anisotropic conductive film of the aspect A described above can be produced by storing each of the spacers in a first opening for storing a spacer of the transfer mold having the first opening at a position corresponding to the central part of the anisotropic conductive film in the width direction, pushing the first insulating adhesion layer that constitutes the anisotropic conductive film and has the dispersed conductive particles into a surface having the first opening of the transfer mold to transfer and bond the spacers to the first insulating adhesion layer, and layering the second insulating adhesion layer.

(Production Method 3)

The anisotropic conductive film of the aspect B described above can be produced by storing each of the spacers in a first opening for storing a spacer of the transfer mold having the first opening at a position corresponding to the central part of the anisotropic conductive film in the width direction, pushing the second insulating adhesion layer that constitutes the anisotropic conductive film into a surface having the first opening of the transfer mold to transfer and bond the spacers to the second insulating adhesion layer, and layering the first insulating adhesion layer that constitutes the anisotropic conductive film and has the dispersed conductive particles.

(Production Method 4)

The anisotropic conductive film of the aspect C described above can be produced by storing each of the spacers in a first opening for storing a spacer of a transfer mold having the first opening at a position corresponding to the central part of the anisotropic conductive film in the width direction and a second opening for storing a conductive particle at a part other than the position, storing each of the conductive particles in the second opening, pushing the first insulating adhesion layer that constitutes the anisotropic conductive film and has the dispersed conductive particles into a surface having the first and second openings of the transfer mold to transfer and bond the spacers to the first insulating adhesion layer, and layering the second insulating adhesion layer.

(Production Method 5)

The anisotropic conductive film of the aspect D described above can be produced by:

storing each of the spacers in a first opening for storing a spacer of a first transfer mold having the first opening at a position corresponding to the central part of the anisotropic conductive film in the width direction, and pushing the first insulating adhesion layer that constitutes the anisotropic conductive film into a surface having the first opening of the first transfer mold to transfer and bond the spacers to the first insulating adhesion layer;

storing each of the conductive particles in a second opening for storing a conductive particle of a second transfer mold having the second opening at a position corresponding to a part other than the central part of the anisotropic conductive film in the width direction, and pushing the second insulating adhesion layer that constitutes the anisotropic conductive film into a surface having the second opening of the second transfer mold to transfer and bond the conductive particles to the second insulating adhesion layer; and layering the first insulating adhesion layer to which the spacers have been transferred and bonded and the second insulating adhesion layer to which the conductive particles have been transferred and bonded so that the spacers and the conductive particles are located inside.

<Transfer Mold, First Transfer Mold, and Second Transfer Mold (Hereinafter Sometimes Simply Referred to as Transfer Mold)>

In the production methods, the transfer mold is, for example, a mold in which an opening is formed in an inorganic material such as silicone, various ceramics, glass, and metal including stainless steel, or an organic material such as various resins by a publicly known opening-forming method such as a photolithography method. Such a transfer mold may have a shape of a plate, a roll, or the like.

Examples of each shape of the first and second openings of the transfer mold may include a columnar shape, a polygonal prism shape such as a quadrangular prism shape, and a pyramidal shape such as a quadrangular pyramidal shape.

The arrangements of the first opening and the second opening are arrangements corresponding to the regular patterns of the spacers and the conductive particles, respectively.

The diameter and depth of the first and second openings of the transfer mold can be measured by a laser microscope.

A procedure for storing each of the spacers in the first opening of the transfer mold and a procedure for storing each of the conductive particles in the second opening of the transfer mold are not particularly limited, and a publicly known procedure can be utilized. For example, a dried powder of the conductive particles or a dispersion liquid in which the powder is dispersed in a solvent is sprayed on or applied to the surface having the opening of the transfer mold, and the surface having the opening may be wiped using a brush, a blade, or the like.

(First Opening)

The ratio of the diameter of the first opening (first opening diameter) to the average particle diameter of the spacers (=first opening diameter/average diameter of the spacers) is preferably 1.1 or more and 2.0 or less, more preferably 1.2 or more and 1.8 or less, and particularly preferably 1.3 or more and 1.7 or less in terms of balance between easy storing of the spacers, easy pushing of an insulating resin, and the like.

The ratio of the average particle diameter of the spacers to the depth of the first opening (first opening depth) (=average diameter of the spacers/first opening depth) is preferably 0.4 or more and 3.0 or less, and more preferably 0.5 or more and 1.5 or less in terms of balance between improved transferring properties, spacer retention capability, and the like.

The ratio of the bottom diameter of the first opening on a bottom side (first opening bottom diameter) to the average particle diameter of the spacers (=first opening base diameter/average particle diameter of the spacers) is preferably 1.1 or more and 2.0 or less, more preferably 1.2 or more and 1.7 or less, and particularly preferably 1.3 or more and 1.6 or less with respect to the average particle diameter of the spacers in terms of balance between easy storing of the spacers, easy pushing of the insulating resin, and the like.

(Second Opening)

The ratio of the diameter of the second opening (second opening diameter) to the average particle diameter of the conductive particles (=second opening diameter/average particle diameter of the conductive particles) is preferably 1.1 or more and 2.0 or less, and more preferably 1.3 or more and 1.8 or less in terms of balance between easy storing of the conductive particles, easy pushing of the insulating resin, and the like.

The ratio of the average particle diameter of the conductive particles to the depth of the second opening (second opening depth) (=average particle diameter of the conductive particles/second opening depth) is preferably 0.4 or more and 3.0 or less, and more preferably 0.5 or more and 1.5 or less in terms of balance between improved transferring properties, conductive particle retention capability, and the like.

The ratio of the bottom diameter of the second opening on a bottom side (second opening bottom diameter) to the average particle diameter of the conductive particles (=second opening bottom diameter/average particle diameter of the conductive particles) is preferably 1.1 or more and 2.0 or less, more preferably 1.2 or more and 1.7 or less, and particularly preferably 1.3 or more and 1.6 or less with respect to the average particle diameter of the conductive particles in terms of balance between easy storing of the conductive particles, easy pushing of the insulating resin, and the like.

When the first insulating adhesion layer and the second insulating adhesion layer are layered, it is preferable that the first insulating adhesion layer be subjected to a pre-curing treatment (heating, irradiation with ultraviolet light, or the like). Thus, the conductive particles or the spacers may be temporarily fixed.

<<Application of Anisotropic Conductive Film>>

The anisotropic conductive film thus obtained can be preferably applied to anisotropic conductive connection between the first electronic component such as an IC chip and an IC module and the second electronic component such as a flexible substrate and a glass substrate by heat or light. A connection structure obtained as described above is also a part of the present invention. In this case, it is preferable that the anisotropic conductive film be temporarily bonded to the second electronic component such as a wiring substrate, the first electronic component such as an IC chip be mounted on the anisotropic conductive film temporarily bonded, and they be thermocompression-bonded from a side of the first electronic component since the connection reliability is enhanced. Further, connection can also be achieved by light curing.

EXAMPLES

Hereinafter, the present invention will be described more specifically by Examples. Structures of the following anisotropic conductive films of Examples 1, 5, and 9 are a structure of the following aspect A (see FIG. 4), anisotropic conductive films of Examples 2, 6, and 10 have a structure of the aspect B (see FIG. 5), anisotropic conductive films of Examples 3, 7, and 11 have a structure of the aspect C (see FIG. 6), and anisotropic conductive films of Examples 4, 8, and 12 have a structure of the aspect D (see FIG. 7).

Example 1 (Aspect A)

(Formation of First Insulating Adhesion Layer in which Conductive Particles are Dispersed and Held)

60 Parts by mass of phenoxy resin (YP-50, NIPPON STEEL & SUMIKIN CHEMICAL CO., LTD.), 40 parts by mass of acrylate (EP600, DAICEL-ALLNEX LTD.), 2 parts by mass of photo-radical polymerization initiator (IRGACURE 369, Mitsubishi Chemical Corporation), and 50 parts by mass of conductive particle having an average particle diameter of 4 μm (Ni/Au plating resin particles, AUL 704, SEKISUI CHEMICAL CO., LTD.) were mixed in toluene to prepare a mixed liquid having a solid content of 50% by mass. This mixed liquid was applied to a polyethylene terephthalate release film (PET release film) having a thickness of 50 μm so as to have a dried thickness of 6 and dried in an oven at 80° C. for 5 minutes, to form a first insulating adhesion layer of photo-radical polymerization type.

(Transfer Mold for Spacer)

Next, a stainless steel transfer mold in which first openings having a diameter of 23 μm and a depth of 15 μm were provided at a vertical pitch of 30 μm for a spacer in a pattern shown in FIG. 3A was prepared.

Each of spherical spacers having an average particle diameter (spacer height) of 15 μm (SSX-115, SEKISUI PLASTICS CO., Ltd.) was stored in each of the first openings of this transfer mold.

(Formation of First Insulating Adhesion Layer in which Spacers are Arranged)

A surface having the openings of this transfer mold and the first insulating adhesion layer were faced to each other, and pressurized from a side of the release film under a condition of 0.5 MPa at 60° C. to push the spacers into the first insulating adhesion layer.

Subsequently, the first insulating adhesion layer was irradiated with ultraviolet light having a wavelength of 365 nm at an integrated light amount of 4,000 mJ/cm$^2$ from a side of the conductive particles. Thus, the first insulating adhesion layer in which the spacers were temporarily fixed at a central part of the surface and the conductive particles were dispersed and held was formed.

(Formation of Second Insulating Adhesion Layer)

Next, 60 parts by mass of phenoxy resin (YP-50, NIPPON STEEL & SUMIKIN CHEMICAL CO., LTD.), 40 parts by mass of epoxy resin (jER828, Mitsubishi Chemical Corporation), and 2 parts by mass of photo-cationic polymerization initiator (SI-60, SANSHIN CHEMICAL INDUSTRY CO., LTD.) were mixed in toluene to prepare a mixed liquid having a solid content of 50% by mass. This mixed liquid was applied to a PET release film having a thickness of 50 Jim so as to have a dried thickness of 12 μm, and dried in an oven at 80° C. for 5 minutes, to form a second insulating adhesion layer that was comparatively thicker.

(Lamination of First Insulating Adhesion Layer and Second Insulating Adhesion Layer)

The thus obtained first insulating adhesion layer and the second insulating adhesion layer that was comparatively thicker were laminated under conditions of 60° C. and 0.5 MPa so that the spacers were located inside, to obtain an anisotropic conductive film.

Example 2 (Aspect B)

(Formation of First Insulating Adhesion Layer in which Conductive Particles are Dispersed and Held)

A first insulating adhesion layer containing conductive particles was formed in the same manner as in Example 1. Further, the first insulating adhesion layer was irradiated with ultraviolet light having a wavelength of 365 nm at an integrated light amount of 4,000 mJ/cm$^2$. Thus, the first insulating adhesion layer in which the conductive particles were dispersed and held was formed.

(Formation of Second Insulating Adhesion Layer in which Spacers are Arranged on Surface)

Next, 60 parts by mass of phenoxy resin (YP-50, NIPPON STEEL & SUMIKIN CHEMICAL CO., LTD.), 40 parts by mass of epoxy resin (jER828, Mitsubishi Chemical. Corporation), and 2 parts by mass of photo-cationic polymerization initiator (SI-60, SANSHIN CHEMICAL INDUSTRY CO., LTD.) were mixed in toluene to prepare a mixed liquid having a solid content of 50% by mass. This mixed liquid was applied to a PET release film having a thickness of 50 μm so as to have a dried thickness of 12 μm, and dried in an oven at 80° C. for 5 minutes, to form a second insulating adhesion layer that was comparatively thicker.

Next, a stainless steel transfer mold in which first openings having a diameter of 23 μm and a depth of 15 μm were provided at a vertical pitch of 30 μm for a spacer in a pattern shown in FIG. 3A was prepared.

Each of spherical spacers having an average particle diameter (spacer height) of 15 μm (SSX-115, SEKISUI PLASTICS CO., Ltd.) was stored in each of the first openings of this transfer mold.

A surface having the openings of this transfer mold and the second insulating adhesion layer were faced to each other, and pressurized from a side of the release film under a condition of 0.5 MPa at 60° C. to push the spacers into the second insulating adhesion layer.

Subsequently, the second insulating adhesion layer was irradiated with ultraviolet light having a wavelength of 365 nm at an integrated light amount of 4,000 mJ/cm$^2$ from a side of the conductive particles. Thus, the second insulating adhesion layer in which the spacers were temporarily fixed at a central part of the surface was formed.

(Lamination of First Insulating Adhesion Layer and Second Insulating Adhesion Layer)

The thus obtained first insulating adhesion layer in which the conductive particles were dispersed and held and the second insulating adhesion layer that had the temporarily fixed spacers at the central part of the surface and was comparatively thicker were laminated under conditions of 60° C. and 0.5 MPa so that the spacers were located inside, to obtain an anisotropic conductive film.

Example 3 (Aspect C)

(Formation of First Insulating Adhesion Layer in which Conductive Particles and Spacers are Arranged on Surface)

A stainless steel transfer mold in which first openings having a diameter of 23 μm and a depth of 15 μm were provided at a vertical pitch of 30 μm for a spacer in a pattern shown in FIG. 3A and second openings having a diameter of 6 μm and a depth of 4 μm in the surface except for the central part were two-dimensionally provided at a pitch of 4 μm was prepared.

Each of spherical spacers having an average particle diameter (spacer height) of 15 μm (SSX-115, SEKISUI PLASTICS CO., Ltd.) was stored in each of the first openings of this transfer mold. Next, each of conductive particles having an average particle diameter of 4 μm (Ni/Au plating resin particles, AUL 704, available from SEKISUI CHEMICAL CO., LTD.) was stored in each of the second openings.

60 Parts by mass of phenoxy resin (YP-50, NIPPON STEEL & SUMIKIN CHEMICAL CO., LTD.), 40 parts by mass of acrylate (EP600, DANCEL-ALLNEX LTD.), and 2 parts by mass of photo-radical polymerization initiator (IR-GACURE 369, Mitsubishi Chemical Corporation) were mixed in toluene to prepare a mixed liquid having a solid content of 50% by mass. This mixed liquid was applied to a polyethylene terephthalate release film (PET release film) having a thickness of 50 μm so as to have a dried thickness of 6 μm, and dried in an oven at 80° C. for 5 minutes, to form a first insulating adhesion layer of photo-radical polymerization type.

The first insulating adhesion layer containing no conductive particle was pressurized against the transfer mold prepared above from a side of the release film under a condition of 0.5 MPa at 60° C. to push the spacers and the conductive particles into the first insulating adhesion layer.

Subsequently, the first insulating adhesion layer was irradiated with ultraviolet light having a wavelength of 365 nm at an integrated light amount of 4,000 mJ/cm$^2$ from a side of the conductive particles. Thus, the first insulating adhesion layer in which the spacers were temporarily fixed at a central part of the surface and the conductive particles were temporarily fixed around the central part was formed.
(Formation of Second Insulating Adhesion Layer)

Next, 60 parts by mass of phenoxy resin (YP-50, NIPPON STEEL & SUMIKIN CHEMICAL CO., LTD.), 40 parts by mass of epoxy resin (jER828, Mitsubishi Chemical Corporation), and 2 parts by mass of photo-cationic polymerization initiator (SI-60, SANSHIN CHEMICAL INDUSTRY CO., LTD.) were mixed in toluene to prepare a mixed liquid having a solid content of 50% by mass. This mixed liquid was applied to a PET release film having a thickness of 50 μm so as to have a dried thickness of 12 μm, and dried in an oven at 80° C. for 5 minutes, to form a second insulating adhesion layer that was comparatively thicker.
(Lamination of First Insulating Adhesion Layer and Second Insulating Adhesion Layer)

Subsequently, the thus obtained first insulating adhesion layer in which the conductive particles and the spacers were arranged on a surface and the second insulating adhesion layer that was comparatively thicker were laminated under conditions of 60° C. and 0.5 MPa so that the spacers were located inside, to obtain an anisotropic conductive film.

Example 4 (Aspect D)

Formation of Second Insulating Adhesion Layer in which Spacers are Arranged on Surface A stainless steel transfer mold 1 in which first openings having a diameter of 23 μm and a depth of 15 μm were provided at a vertical pitch of 30 μm for a spacer in a pattern shown in FIG. 3A was prepared. Each of spherical spacers having an average particle diameter (spacer height) of 15 μm (SSX-115, SEKISUI PLASTICS CO., Ltd.) was stored in each of the first openings of this transfer mold.

60 Parts by mass of phenoxy resin (YP-50, NIPPON STEEL SUMIKIN CHEMICAL CO., LTD.), 40 parts by mass of epoxy resin (jER828, Mitsubishi Chemical Corporation), and 2 parts by mass of photo-cationic polymerization initiator (SI-60, SANSHIN CHEMICAL INDUSTRY CO., LTD.) were mixed in toluene to prepare a mixed liquid having a solid content of 50% by mass. This mixed liquid was applied to a PET release film having a thickness of 50 μm so as to have a dried thickness of 12 μm, and dried in an oven at 80° C. for 5 minutes, to form a second insulating adhesion layer that was comparatively thicker.

A surface having the openings of this transfer mold and the second insulating adhesion layer were faced to each other, and pressurized from a side of the release film under a condition of 0.5 MPa at 60° C. to push the spacers into the second insulating adhesion layer.

Subsequently, the second insulating adhesion layer was irradiated with ultraviolet light having a wavelength of 365 nm at an integrated light amount of 4,000 mJ/cm² from a side of the conductive particles. Thus, the second insulating adhesion layer in which the spacers were temporarily fixed at a central part of the surface was formed.
(Formation of First Insulating Adhesion Layer in which Conductive Particles are Arranged on Surface)

A stainless steel transfer mold in which second openings having a diameter of 6 μm and a depth of 4 μm were provided two-dimensionally at a pitch of 4 μm for a conductive particle in a surface was prepared. Each of conductive particles having an average particle diameter of 4 μm (Ni/Au plating resin particles, AUL 704, available from SEKISUI CHEMICAL CO., LTD.) was stored in each of the second openings.

60 Parts by mass of phenoxy resin (YP-50, NIPPON STEEL & SUMIKIN CHEMICAL CO., LTD.), 40 parts by mass of acrylate (EP600, DAICEL-ALLNEX Ltd.), and 2 parts by mass of photo-radical polymerization initiator (IRGACURE 369, Mitsubishi Chemical Corporation) were mixed in toluene to prepare a mixed liquid having a solid content of 50% by mass. This mixed liquid was applied to a polyethylene terephthalate release film (PET release film) having a thickness of 50 μm so as to have a dried thickness of 6 μm, and dried in an oven at 80° C. for 5 minutes, to form a first insulating adhesion layer of photo-radical polymerization type.

The first insulating adhesion layer was pressurized against the transfer mold prepared above from a side of the release film under a condition of 0.5 MPa at 60° C. to push the conductive particles into the first insulating adhesion layer.

Subsequently, the first insulating adhesion layer was irradiated with ultraviolet light having a wavelength of 365 nm at an integrated light amount of 4,000 mJ/cm² from a side of the conductive particles. Thus, the first insulating adhesion layer in which the conductive particles were temporarily fixed in the surface was formed.
(Lamination of First Insulating Adhesion Layer and Second Insulating Adhesion Layer)

Subsequently, the thus obtained first insulating adhesion layer in which the conductive particles were arranged on the surface and the second insulating adhesion layer that had the temporarily fixed spacers at the central part of the surface and was comparatively thicker were laminated under conditions of 60° C. and 0.5 MPa so that the spacers were located inside, to obtain an anisotropic conductive film.

Examples 5 to 8

Anisotropic conductive films were obtained in the same manner as in Examples 1 to 4 except that spherical spacers having an average particle diameter (spacer height) of 10 μm (SSX-110, SEKISUI PLASTICS CO., Ltd.) were used instead of the spherical spacers having an average particle diameter (spacer height) of 15 μm.

Examples 9 to 10

Anisotropic conductive films were obtained in the same manner as in Example 1 except that glass columns having a spacer height of 15 μm and a spacer length of 20 μm (Microrod PF series, Nippon Electric Glass Co., Ltd.) was used instead of the spherical spacers having an average particle diameter (spacer height) of 15 μm.

Glass columns that were passed through a 478 mesh sieve a plurality of times to make the heights thereof the same were used. As shown in FIG. 3E, spacers of the glass columns lay and the longitudinal directions thereof were random.

Comparative Example 1

An anisotropic conductive film was obtained in the same manner as in Example 1 except that a spacer was not used.

Comparative Example 2

An anisotropic conductive film was obtained in the same manner as in Example 1 except that in the formation of a first insulating adhesion layer, the first insulating adhesion layer in which spacers were not arranged on a surface of the first insulating adhesion layer and 10 parts by mass of the spacers as well as conductive particles were uniformly dispersed was formed.

<Evaluation>

For the anisotropic conductive films of Examples and Comparative Examples, (a) initial conduction resistance, (b) conduction reliability, (c) short circuit occurrence ratio, and (d) indentation were each tested and evaluated as follows. The obtained results are shown in Table 1. Herein, the indentation is to evaluate the uniformity of pushing of conductive particles against a bump.

(a) Initial Conduction Resistance

The anisotropic conductive film of each of Examples and Comparative Examples was placed between an IC for evaluation of initial conduction and conduction reliability and a glass substrate, and heated and pressurized (180° C., 80 MPa, 5 seconds) to obtain a connection product for each evaluation. The conduction resistance of this connection product for evaluation was measured using a digital multimeter 7557 (Yokogawa Electric Corporation). Herein, the IC for each evaluation and the glass substrate corresponded to the pattern of terminals thereof, and the sizes were as follows.

IC for Evaluation of Initial Conduction
  Outside diameter: 1.8×20 mm
  Thickness: 0.2 mm
  Bump specification: gold-plating, height: 9 μm, size: 30×85 μm
Glass Substrate
  Glass material: available from Corning Incorporated
  Outside diameter: 30×50 mm
  Thickness: 0.5 mm
  Electrode: ITO wiring (b) Conduction Reliability The connection product for evaluation having the IC for evaluation of (a) initial conduction resistance and the anisotropic conductive film of each of Examples and Comparative Examples was left in a constant temperature bath of a temperature of 85° C. and a humidity of 85% RH for 500 hours. After that, the conduction resistance was measured similarly to the measurement of (a) initial conduction resistance. A conduction resistance of 5Ω or more is not preferred in terms of practical conduction stability of a connected electronic component.

(c) Short Circuit Occurrence Ratio

As an IC for evaluation of short circuit occurrence ratio, the following IC (comb-teeth TEG (test element group) having a space of 7.5 μm) was prepared.
  Outside diameter: 1.5×13 mm
  Thickness: 0.5 mm
  Bump specification: gold-plating, height: 15 μm, size: 25×140 μm, Gap between bumps: 7.5 μm The anisotropic conductive film of each of Examples and Comparative Examples was placed between the IC for evaluation of short circuit occurrence ratio and a glass substrate of a pattern corresponding to the pattern of the IC for evaluation (used in the measurement of initial conduction resistance), and heated and pressurized under the same condition as in the measurement of (b), to obtain a connection product. The short circuit occurrence ratio of the connection product was determined. The short circuit occurrence ratio (ppm) was calculated by "occurrence number of short circuit/total number of space of 7.5 μm."

(d) Indentation

As an IC for evaluation of indentation, the following IC was prepared.
  Outside diameter: 1.4×20 mm
  Thickness: 0.2 mm
  Bump specification: gold-plating, height: 15 μm, size: 15×100 μm, staggered arrangement of 3 rows (output bumps: outside bumps in a short side direction of IC were bumps of the first row, bumps at a central side in the short side direction of IC were bumps of the third row, input bumps; 40×60 μm)

The anisotropic conductive film of each of Examples and Comparative Examples was placed between the IC for evaluation of indentation and a glass substrate of a pattern corresponding to the pattern of the IC for evaluation (used in the measurement of initial conduction resistance), and heated and pressurized under the same connection condition as in the test of (a) initial conduction resistance, to obtain a connection product. For the bumps of the first row and the bumps of the third row in an anisotropic conductive connection part of the connection product, 10 bumps were each optionally selected, the presence or absence of indentation on a surface of each of the bumps was examined using an optical microscope from a side of the glass substrate, and evaluated in accordance with the following evaluation criteria. In practice terms, the evaluation is desirably equal to or higher than B.

Rank Criteria
  AA: the number of bumps in which indentation was observed among the 10 observed bumps was 10
  A: the number of bumps in which indentation was observed among the 10 observed bumps was 8 or 9
  B: the number of bumps in which indentation was observed among the 10 observed bumps was 1 to 7
  C: the number of bumps in which indentation was observed among the 10 observed bumps was 0

TABLE 1

| | | Example | | | | | | | | | | | | Comparative Example | |
|---|---|---|---|---|---|---|---|---|---|---|---|---|---|---|---|
| | | 1 | 2 | 3 | 4 | 5 | 6 | 7 | 8 | 9 | 10 | 11 | 12 | 1 | 2 |
| Spacer Arrangement Pattern | Aspect | A | B | C | D | A | B | C | D | A | B | C | D | — | — |
| Spacer Height | (μm) | 15 | 15 | 15 | 15 | 10 | 10 | 10 | 10 | 15 | 15 | 15 | 15 | — | 15 |
| Spacer Shape | | Spherical | Spherical | Spherical | Spherical | Spherical | Spherical | Spherical | Spherical | Column | Column | Column | Column | — | Spherical |
| Initial Conduction Resistance | (Ω) | 0.4 | 0.4 | 0.4 | 0.3 | 0.2 | 0.2 | 0.2 | 0.3 | 0.2 | 0.2 | 0.4 | 0.4 | 3.3 | open |
| Conduction Reliability | (Ω) | 1.2 | 1.5 | 1.1 | 1.1 | 1.0 | 1.2 | 1.1 | 1.2 | 1.1 | 1.1 | 1.3 | 1.2 | 12.2 | open |

TABLE 1-continued

| | | Example | | | | | | | | | | | | Comparative Example | |
|---|---|---|---|---|---|---|---|---|---|---|---|---|---|---|---|
| | | 1 | 2 | 3 | 4 | 5 | 6 | 7 | 8 | 9 | 10 | 11 | 12 | 1 | 2 |
| Short Circuit Occurrence Ratio | (ppm) | <500 | <500 | <50 | <50 | <500 | <500 | <50 | <50 | <500 | <500 | <50 | <50 | <50 | <50 |
| Indentation | First Row | A | A | AA | AA | B | B | A | A | A | A | AA | AA | C | C |
| | Third Row | AA | AA | AA | AA | A | A | AA | AA | AA | AA | AA | AA | A | C |

As seen from Table 1, the anisotropic conductive films of Examples 1 to 12 exhibited results in which problems in practical terms did not occur in all evaluation items. In contrast, in the anisotropic conductive film of Comparative Example 1, indentation was not observed in the bumps of the first row on the outside in the short side direction of the IC since a spacer was not used in Comparative Example 1. Further, the anisotropic conductive film of Comparative Example 2 had a result of "open" in tests of initial conduction resistance and conduction reliability since the spacers were dispersed in the whole film. In addition, indentation was not observed in the bumps of the first row on the outside in the short side direction of the IC and the bumps of the third row.

In particular, the short circuit occurrence ratio in a case (the aspects C and D) where the conductive particles were arranged was especially lower than that in a case (the aspects A and B) where the conductive particles were dispersed. For the shape and size of the spacers, a spherical shape with a height of 15 μm tended to be preferred more than a spherical shape with a height of 10 μm, and a glass column with a height of 15 μm tended to be more preferred.

INDUSTRIAL APPLICABILITY

In the anisotropic conductive film of the present invention, spacers are arranged at a central part thereof in a width direction. For this reason, bending of an IC chip during anisotropic conductive connection can be suppressed. Therefore, the initial conduction value cannot be increased, and the short circuit occurrence ratio can also be suppressed. Accordingly, the anisotropic conductive film is useful in anisotropic conductive connection of an electronic component such as an IC chip to a wiring substrate.

REFERENCE SIGNS LIST 1 spacer
2 conductive particle
10 insulating adhesion layer
41 first insulating adhesion layer
42 second insulating adhesion layer
100 anisotropic conductive film
A spacer-disposing region

The invention claimed is:

1. An anisotropic conductive film containing front and back surfaces, conductive particles, and insulating spacers, wherein:
the spacers are arranged at only a central part of the anisotropic conductive film in a width direction and embedded in the anisotropic conductive film so that, when the anisotropic conductive film is provided between an IC chip and a substrate, the spacers are not disposed between bumps of the IC chip and terminals of the substrate,
the central part of the film in the width direction has a width being 20% or more and 80% or less of an overall width of the film, and
at least one of the front and back surfaces along the entire anisotropic conductive film is substantially flat.

2. The anisotropic conductive film according to claim 1, wherein the spacer has a height in a thickness direction of the anisotropic conductive film being more than 5 μm and less than 75 μm.

3. The anisotropic conductive film according to claim 1, wherein the anisotropic conductive film has a layered structure having a first insulating adhesion layer and a second insulating adhesion layer, the conductive particles are dispersed in the first insulating adhesion layer, and the spacers are regularly arranged on a surface of the first insulating adhesion layer on a side of the second insulating adhesion layer.

4. A production method of the anisotropic conductive film according to claim 3, the method comprising: storing each of the spacers in a first opening for storing a spacer of a transfer mold having the first opening at a position corresponding to the central part of the anisotropic conductive film in the width direction; pushing the first insulating adhesion layer that constitutes the anisotropic conductive film and has the dispersed conductive particles into a surface having the first opening of the transfer mold to transfer and bond the spacers to the first insulating adhesion layer; and further layering the second insulating adhesion layer.

5. The production method according to claim 4, wherein another insulating adhesion layer is layered on another surface of the first insulating adhesion layer.

6. The anisotropic conductive film according to claim 1, wherein the anisotropic conductive film has a layered structure having a first insulating adhesion layer and a second insulating adhesion layer, the conductive particles are dispersed in the first insulating adhesion layer, and the spacers are regularly arranged on a surface of the second insulating adhesion layer on a side of the first insulating adhesion layer.

7. A production method of the anisotropic conductive film according to claim 6, the production method comprising: storing each of the spacers in a first opening for storing a spacer of a transfer mold having the first opening at a position corresponding to the central part of the anisotropic conductive film in the width direction; pushing the second insulating adhesion layer that constitutes the anisotropic conductive film into a surface having the first opening of the transfer mold to transfer and bond the spacers to the second insulating adhesion layer; and further layering the first insulating adhesion layer that constitutes the anisotropic conductive film and has the dispersed conductive particles.

8. The anisotropic conductive film according to claim 1, wherein the anisotropic conductive film has a layered structure having a first insulating adhesion layer and a second insulating adhesion layer, and the conductive particles and the spacers are each regularly arranged on a surface of the first insulating adhesion layer on a side of the second insulating adhesion layer.

9. A production method of the anisotropic conductive film according to claim 8, the method comprising: storing each of the spacers in a first opening for storing a spacer of a transfer mold having the first opening at a position corresponding to the central part of the anisotropic conductive film in the width direction and a second opening for storing a conductive particle at a part other than the position; subsequently storing each of the conductive particles in the second opening; pushing the first insulating adhesion layer that constitutes the anisotropic conductive film and has the dispersed conductive particles into a surface having the first and second openings of the transfer mold to transfer and bond the spacers to the first insulating adhesion layer; and further layering the second insulating adhesion layer.

10. The anisotropic conductive film according to claim 1, wherein the anisotropic conductive film has a layered structure having a first insulating adhesion layer and a second insulating adhesion layer, the conductive particles are regularly arranged on a surface of the first insulating adhesion layer on a side of the second insulating adhesion layer, and the spacers are regularly arranged on a surface of the second insulating adhesion layer on a side of the first insulating adhesion layer.

11. A method for producing the anisotropic conductive film according to claim 10, the method comprising:
storing each of the spacers in a first opening for storing a spacer of a first transfer mold having the first opening at a position corresponding to the central part of the anisotropic conductive film in the width direction, and pushing the first insulating adhesion layer that constitutes the anisotropic conductive film into a surface having the first opening of the first transfer mold to transfer and bond the spacers to the first insulating adhesion layer;
storing each of the conductive particles in a second opening for storing a conductive particle of a second transfer mold having the second opening at a position corresponding to a part other than the central part of the anisotropic conductive film in the width direction, and pushing the second insulating adhesion layer that constitutes the anisotropic conductive film into a surface having the second opening of the second transfer mold to transfer and bond the conductive particles to the second insulating adhesion layer; and
layering the first insulating adhesion layer to which the spacers have been transferred and bonded and the second insulating adhesion layer to which the conductive particles have been transferred and bonded so that the spacers and the conductive particles are located inside.

12. A production method of the anisotropic conductive film according to claim 1, the method comprising: storing each of the spacers in a first opening for storing a spacer of a transfer mold having the first opening at a position corresponding to the central part of the anisotropic conductive film in the width direction; and pushing an insulating adhesion layer that constitutes the anisotropic conductive film into a surface having the first opening of the transfer mold to transfer and bond the spacers to the insulating adhesion layer.

13. A connection structure in which a first electronic component is subjected to anisotropic conductive connection to a second electronic component through the anisotropic conductive film according to claim 1.

14. A method for connecting a first electronic component and a second electronic component by anisotropic conductive connection through the anisotropic conductive film according to claim 1, the method comprising:
temporarily bonding the anisotropic conductive film to the second electronic component; mounting the first electronic component on the temporarily bonded anisotropic conductive film; and thermocompression-bonding them from a side of the first electronic component.

15. A production method of an anisotropic conductive film containing conductive particles and spacers, wherein the spacers are arranged at a central part of the anisotropic conductive film in a width direction, the method comprising: storing each of the spacers in a first opening for storing a spacer of a transfer mold having the first opening at a position corresponding to the central part of the anisotropic conductive film in the width direction; and pushing an insulating adhesion layer that constitutes the anisotropic conductive film into a surface having the first opening of the transfer mold to transfer and bond the spacers to the insulating adhesion layer.

16. A production method of an anisotropic conductive film having front and back surfaces and comprising conductive particles and spacers, the method comprising:
storing each of the spacers in a first opening for storing a spacer of a transfer mold having the first opening at a position corresponding to the central part of the anisotropic conductive film in the width direction; and
pushing a first insulating adhesion layer into a surface having the first opening of the transfer mold to transfer and bond the spacers to the first insulating adhesion layer,
wherein the spacers are arranged at a central part of the anisotropic conductive film in a width direction and embedded in the anisotropic conductive film, and at least one of the front and back surfaces along the entire anisotropic conductive film is substantially flat.

17. The method according to claim 16, further comprising:
layering a second insulating adhesion layer onto the first insulating adhesion layer so that the anisotropic conductive film has a layered structure,
wherein the spacers are regularly arranged on a surface of the first insulating adhesion layer on a side of the second insulating adhesion layer.

18. The method according to claim 17, wherein the surface having the first opening also has a second opening at a part other than a position of the first opening, and the method further comprises, before pushing the first insulating adhesion layer into the surface having the first and second openings:
storing each of the conductive particles in the second opening,
wherein the conductive particles are regularly arranged on a surface of the first insulating adhesion layer on a side of the second insulating adhesion layer.

19. The method according to claim 17, further comprising, before layering the first and second insulating adhesion layers:

storing each of the conductive particles in a second opening for storing a conductive particle of a second transfer mold having the second opening at a position corresponding to a part other than the central part of the anisotropic conductive film in the width direction; and pushing the second insulating adhesion layer into a surface having the second opening of the second transfer mold to transfer and bond the conductive particles to the second insulating adhesion layer, wherein the conductive particles are regularly arranged on a surface of the second insulating adhesion layer on a side of the first insulating adhesion layer.

* * * * *